(12) United States Patent
Flanigan

(10) Patent No.: US 6,258,227 B1
(45) Date of Patent: Jul. 10, 2001

(54) METHOD AND APPARATUS FOR FABRICATING A WAFER SPACING MASK ON A SUBSTRATE SUPPORT CHUCK

(75) Inventor: Allen Flanigan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/268,101

(22) Filed: Mar. 13, 1999

(51) Int. Cl.[7] .................................................. C23C 14/34
(52) U.S. Cl. .................... 204/298.11; 118/720; 118/721; 118/504; 118/505; 427/282
(58) Field of Search ................... 204/298.11, 298.15; 118/720, 721, 504, 505; 361/234; 427/282

(56) References Cited

U.S. PATENT DOCUMENTS

| | | | |
|---|---|---|---|
| 5,117,121 | 5/1992 | Watanabe et al. | 307/130 |
| 5,656,093 | 8/1997 | Burkhart et al. | 118/728 |
| 5,841,624 | * 11/1998 | Xu et al. | 361/234 |
| 5,863,396 | 1/1999 | Flanigan . | |

\* cited by examiner

Primary Examiner—Nam Nguyen
Assistant Examiner—Gregg Cantelmo
(74) Attorney, Agent, or Firm—Thomason, Moser & Patterson, L.L.P.

(57) ABSTRACT

A method and apparatus for fabricating a wafer spacing mask on a workpiece support chuck. Such apparatus is a central body containing a plurality of apertures that is positioned atop the workpiece support chuck and an outer ring shaped body positioned on a flange of the workpiece support chuck while material is deposited onto the apparatus and through the apertures onto chuck. Upon completion of the deposition process, the central body and ring shaped body are removed from the workpiece support chuck leaving deposits of the material to form the wafer spacing mask.

13 Claims, 4 Drawing Sheets

METHOD AND APPARATUS FOR FABRICATING A WAFER SPACING MASK ON A SUBSTRATE SUPPORT CHUCK

CROSS-REFERENCE TO A RELATED APPLICATION

This application contains material that is similar to commonly assigned U.S. Pat. No. 5,863,396 issued Jan. 26, 1999.

BACKGROUND OF THE DISCLOSURE

1. Field of the Invention

The invention relates to a sputter mask or stencil used to control deposition of material in a physical vapor deposition (PVD) system. More particularly, the invention relates to a method and apparatus for precise deposition of target material on the surface of a substrate support chuck using a PVD system to fabricate a wafer spacing mask.

2. Description of the Background Art

Substrate support chucks are widely used to support substrates within semiconductor processing systems. A particular type of chuck is a ceramic electrostatic chuck that is used in high-temperature semiconductor processing systems such as high-temperature physical vapor deposition (PVD). These chucks are used to retain semiconductor wafers, or other workpieces, in a stationary position during processing. Such electrostatic chucks contain one or more electrodes imbedded within a ceramic chuck body. The ceramic material is typically aluminum-nitride or alumina doped with a metal oxide such as titanium oxide ($TiO_2$) or some other ceramic material with similar resistive properties. This form of ceramic is partially conductive at high temperatures.

In the traditional use of ceramic electrostatic chucks, a wafer rests flush against the surface of the chuck body as chucking voltage is applied to the electrodes. Because of the conductive nature of the ceramic material at high temperatures, the wafer is primarily retained against the ceramic support surface by the Johnsen-Rahbek effect. Such a chuck is disclosed in U.S. Pat. No. 5,117,121 issued May 26, 1992.

One disadvantage of using a chuck body fabricated from ceramic is that, during manufacture of the support, the ceramic material is "lapped" to produce a relatively smooth surface. Such lapping produces particles that adhere to the surface of the support. These particles are very difficult to completely remove from the surface. The lapping process may also fracture the surface of the chuck body. Consequently, as the chuck is used, particles are continuously produced by these fractures. Additionally, during wafer processing, the ceramic material can abrade an oxide coating or layer on the underside of the wafer resulting in further introduction of particulate contaminants to the process environment. During use of the chuck, the particles can adhere themselves to the underside of the wafer and be carried to other process chambers or cause defects in the circuitry fabricated upon the wafer. It has been found that tens of thousands of contaminant particles can adhere to the backside of a given wafer after retention upon a ceramic electrostatic chuck.

Similarly, substrate support chucks that are used in low-temperature processing (e.g., less than 300 degrees Celsius) may also produce contaminant particles that interfere with the wafer processing. Such low-temperature chucks include electrostatic chucks and mechanical clamping chucks which contain wafer support surfaces that are typically fabricated from dielectric materials such as alumina. These types of chucks have also been found to produce particular contaminants during use that can adhere to the underside of the wafer during processing.

To overcome the disadvantages associated with the workpiece substrate contacting the substrate support chuck, a wafer spacing mask is deposited upon the surface of the substrate support chuck. Such a wafer spacing mask is disclosed in U.S. Pat. No. 5,656,093 issued Aug. 12, 1997 to Burkhart et al. and herein incorporated by reference. The material deposited upon the support surface of the chuck body, i.e., the wafer spacing mask, is a metal such as titanium, titanium nitride, stainless steel and the like. other materials, including conductors, insulators and semiconductors, that have superior contact properties can also be used to fabricate the spacing mask. Additionally, a mask may comprise combinations of materials, e.g., a metallic layer supported by an insulator layer and the like. The material supports a semiconductor wafer in such a way that the surface of the wafer that faces the chuck is spaced-apart and substantially parallel to the surface of the chuck. Usually the material is deposited to form a plurality of pads, although any wafer spacing mask pattern deposited on the surface of the substrate support chuck may be used. Thus, the wafer spacing mask reduces the amount of contaminant particles that adhere to the underside of the wafer. Heretofore, there was not available a repeatable technique for fabricating such a wafer spacing mask.

Therefore, a need exists in the art for a method and apparatus for fabricating a wafer spacing mask.

SUMMARY OF THE INVENTION

The disadvantages heretofore associated with the prior art are overcome by a method and apparatus for fabricating a wafer spacing mask on a substrate support chuck. Specifically, the invention is a sputter mask or stencil used in a deposition process to form the wafer spacing mask on the substrate support chuck.

The stencil contains a central body, disposed upon a support surface of the substrate support chuck and an outer body disposed upon a flange radially outward of the support surface. The central body has a plurality of apertures, preferably 270, arranged as a pattern of concentric rings disposed therein and a plurality of slots, preferably 9, disposed its periphery. The apertures permit material to be deposited on the central body and the exposed surface of the substrate support. The outer body is ring shaped and both it and the central body are fabricated from the same material such as ceramic, silicon, aluminum nitride and boron nitride.

Another feature of the apparatus is an alignment pin support disposed below said central body. The alignment pin support has at least two alignment pins projecting upward therefrom that communicate with a corresponding number of alignment bores disposed in the central body so that the stencil is properly oriented on the support surface. Preferably, the alignment pins are disposed at angles of +60° and −60° respectively with respect to a y-axis of the alignment pin support. The alignment pin support is a C-shaped body having a first end and a second end wherein the first end transitions to an extension tab. The extension tab is received in a connector of a chamber assembly so that the apparatus is repeatably positioned oriented with respect to the support surface.

A method of fabricating a wafer spacing mask on a support surface of a substrate support chuck is accomplished by masking the support surface using a stencil. Specifically, the method comprises the steps of positioning a plate on a support surface of a workpiece support chuck, where said plate contains a pattern of apertures; depositing a material onto the plate and through said apertures to form deposits upon the support surface of the workpiece support chuck; and removing said plate and leaving said deposits of the material upon said support surface of said workpiece support chuck to form the wafer spacing mask. The plate contains a plurality of slots disposed at its periphery and said depositing step further comprises the step of depositing the material through the slots and onto a flange that radially extends from the workpiece support chuck. Preferably, a physical vapor deposition process is used to deposit a material such as titanium upon the support surface.

BRIEF DESCRIPTION OF THE DRAWINGS

The teachings of the present invention can be readily understood by considering the following detailed description in conjunction with accompanying drawings, in which.

To facilitate understanding, identical reference numerals have been used, where possible, to designate identical elements that are common to the figures.

DETAILED DESCRIPTION

Figure 1:
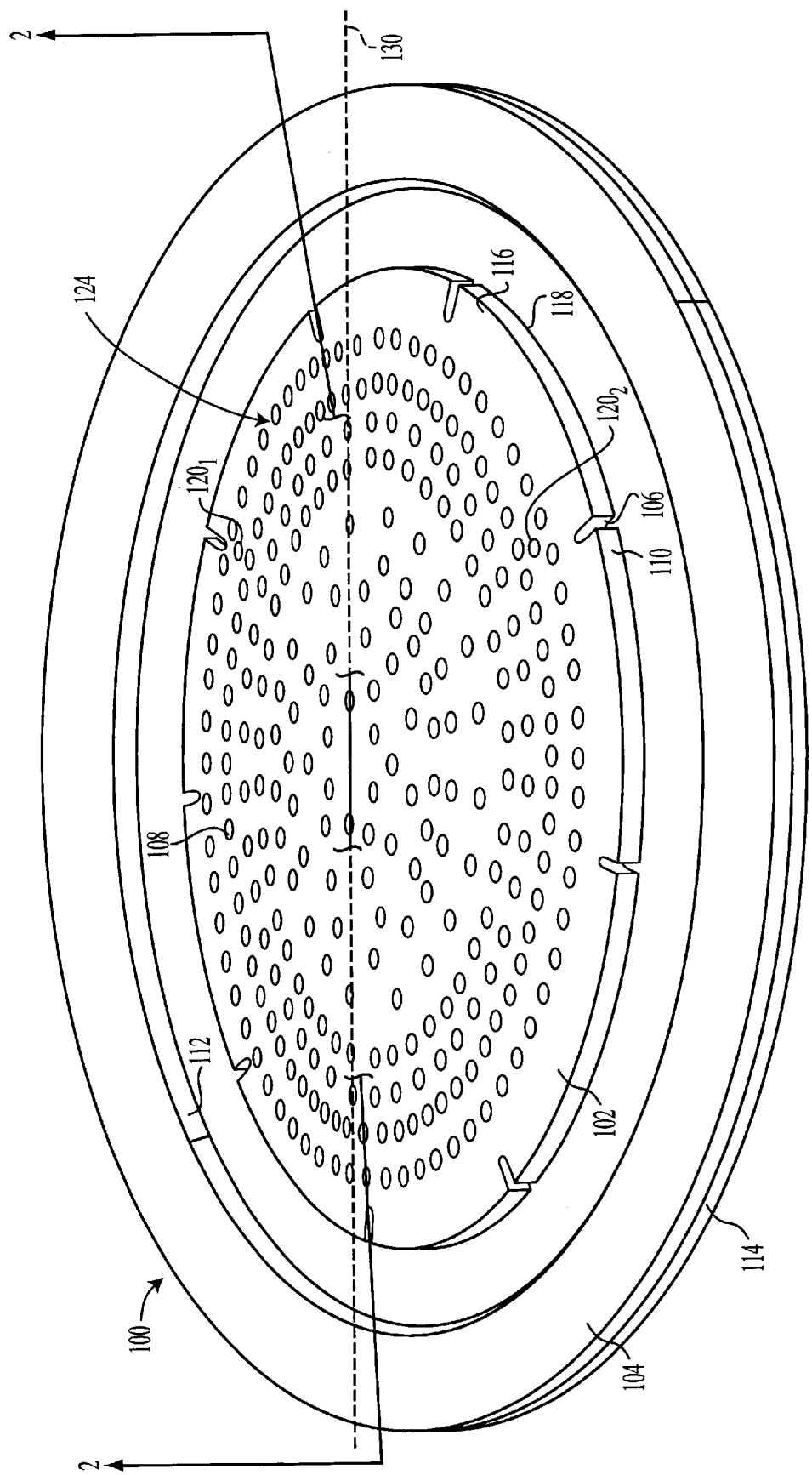
FIG. 1 depicts a perspective view of the stencil of the present invention.
Figure 2:
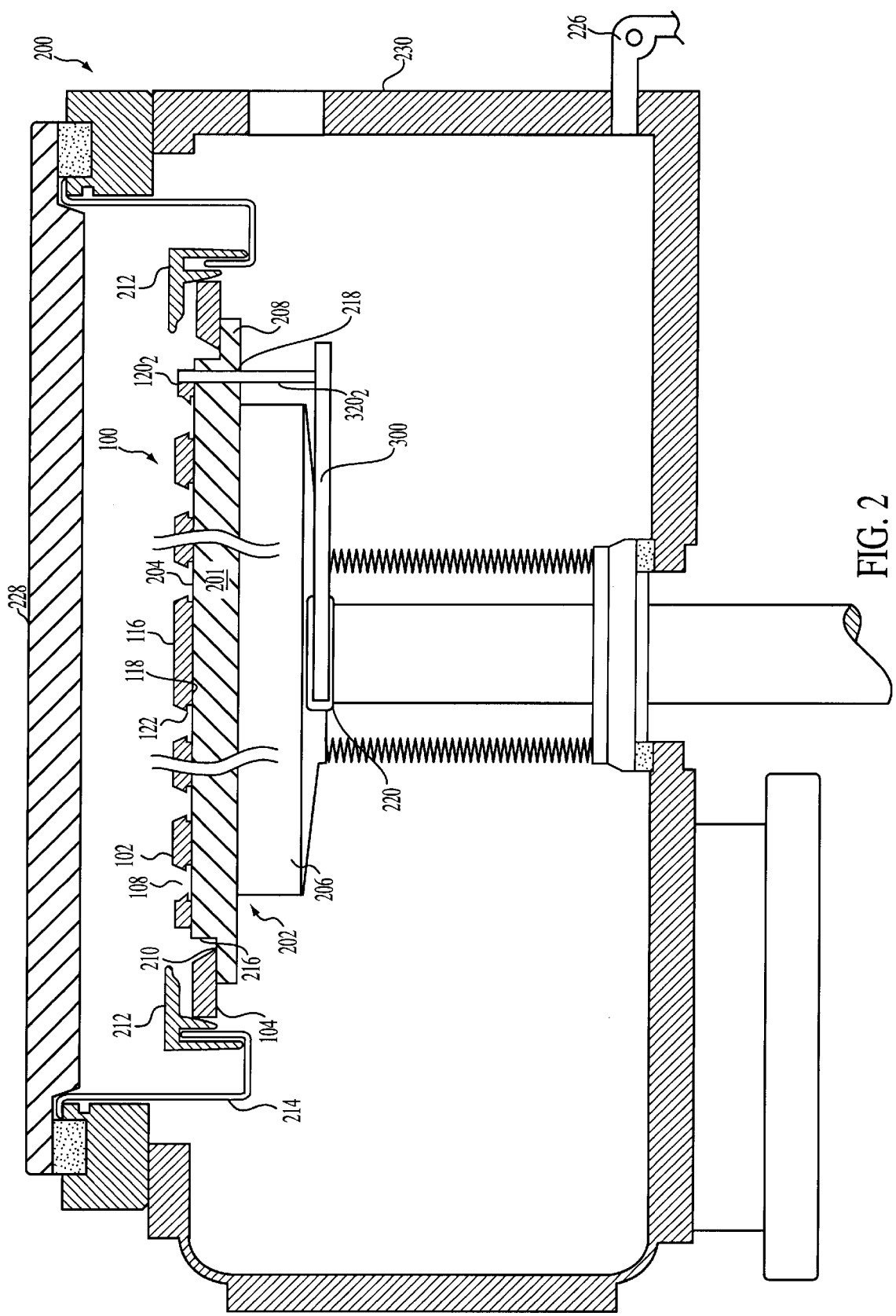
FIG. 2 depicts a cross-sectional view of the stencil positioned on the surface of a substrate support chuck within a physical vapor deposition system.

FIG. 1 depicts a perspective view of a sputter mask or stencil 100 in accordance with the present invention. To illustrate the use of the invention, FIG. 2 depicts a vertical cross-sectional view of the apparatus of FIG. 1, positioned on a surface 204 of a substrate support chuck 202 within a physical vapor deposition (PVD) system 200. The cross-sectional view in FIG. 2 is simplified and not drawn to scale so that features are shown in detail. For best understanding of the invention, the reader should simultaneously refer to both FIGS. 1 and 2 while reading the following disclosure.

Specifically, the stencil 100 comprises a first central body 102 and a second outer body 104 disposed radially outward from the first central body 102. Preferably the central body 102 is plate-shaped and the outer body 104 is ring-shaped. The outer body 104 has an inner face 112 and an outer face 114. The central body 102 further comprises a plurality of slots 106 disposed about a periphery 110 of the central body 102. Additionally, the central body 102 comprises a plurality of apertures 108 disposed therein. The apertures 108 pass fully through the central body 102 from a topside surface 116 to an underside surface 118. The central body further comprises at least two alignment bores $120_1$, $120_2$. The alignment bores are disposed proximate the periphery 110 and preferably at angles of approximately +60° and −60° respectively with respect to a y-axis 130 of the central body 102. Such bores are explained in greater detail below. In a preferred embodiment of the invention, there are nine (9) slots spaced equidistantly about the periphery 110 and 270 apertures. In an alternate embodiment of the invention, there are 384 apertures.

The specific shape and size of the stencil 100 depends on the shape and size of the substrate support chuck 202 for which it is used. Typically, a substrate support chuck 202 is circular in plan form, matching the shape of a workpiece, typically a semiconductor wafer (not shown) and the central body is slightly smaller than the substrate support chuck. For example, for a typical 8 in. (200 mm) diameter semiconductor wafer supported by a substrate support chuck having a diameter of approximately 8 in (200 mm), a diameter of the central body is approximately 7.7 in. Additionally in such an example, a diameter of the outer body 104 measured at the inner face 112 is approximately 8.4 in. and a diameter measured at the outer face 114 is approximately 10.3 in. Although the measurements of a preferred embodiment of the apparatus 100 for use with an 8 in. diameter workpiece is provided, this does not preclude differently sized embodiments. Specifically, a similar apparatus can be constructed for use in systems using 11.8 in. (300 mm) wafers and corresponding substrate support chucks.

As seen in FIG. 2, the substrate support chuck 202 is generally supported upon an assembly 206 for heating, cooling and retaining a workpiece upon the surface 204 of the substrate support chuck 202. Alternately, heating means are incorporated into the substrate support chuck 202. To retain a workpiece on the surface 204, the chuck may contain elements for electrostatically, mechanically or vacuum clamping the workpiece. In order to maintain clarity of the figures, said heating means and electrostatic, mechanical or vacuum elements are not shown but are readily known and available to those skilled in the art of substrate support design and fabrication. The invention is applicable to any chuck type. Therefore, the specific nature of the chuck and its operation is irrelevant to the invention.

The stencil 100 is shaped such that when it is placed on the surface 204 of the substrate support chuck 202, the underside surface 118 of the stencil 100 is supported by the surface 204 of the chuck 202. In the depicted embodiment, the substrate support chuck 202 contains a flange 208 that extends radially from a central portion 201 of the chuck 202. The outer body 104 is disposed proximate the flange 208. Specifically, the outer body 104 contacts a top surface 210 of the flange 208. As such, the outer body 104 is supported by the flange 208. A cover ring 212 (part of the PVD system 200) is disposed radially adjacent the outer body 104. Specifically, the cover ring 212 is contacted by the outer body 104 when the substrate support chuck 202 is brought into position (i.e., raised vertically upward) for forming the wafer spacing mask (i.e., performing PVD of a wafer spacing mask material). When the substrate support chuck 202 is lowered, the cover ring 212 is retained by a shield member 214 disposed radially outward from the cover ring 212.

The surface 204 of the substrate support chuck 202 left exposed by the slots 106 of the central body 102 coincide with a circumferential edge 216 of the central portion 201 of the substrate support chuck 202. As such, deposition material will adhere to the surface 204, edge 216 and the top surface 210 of flange 208. The two-piece construction of the apparatus 100 allows for deposits that lie on the surface 204 of the chuck 202 to be connected to the deposits on the edge 216 and the flange 208.

Figure 3:
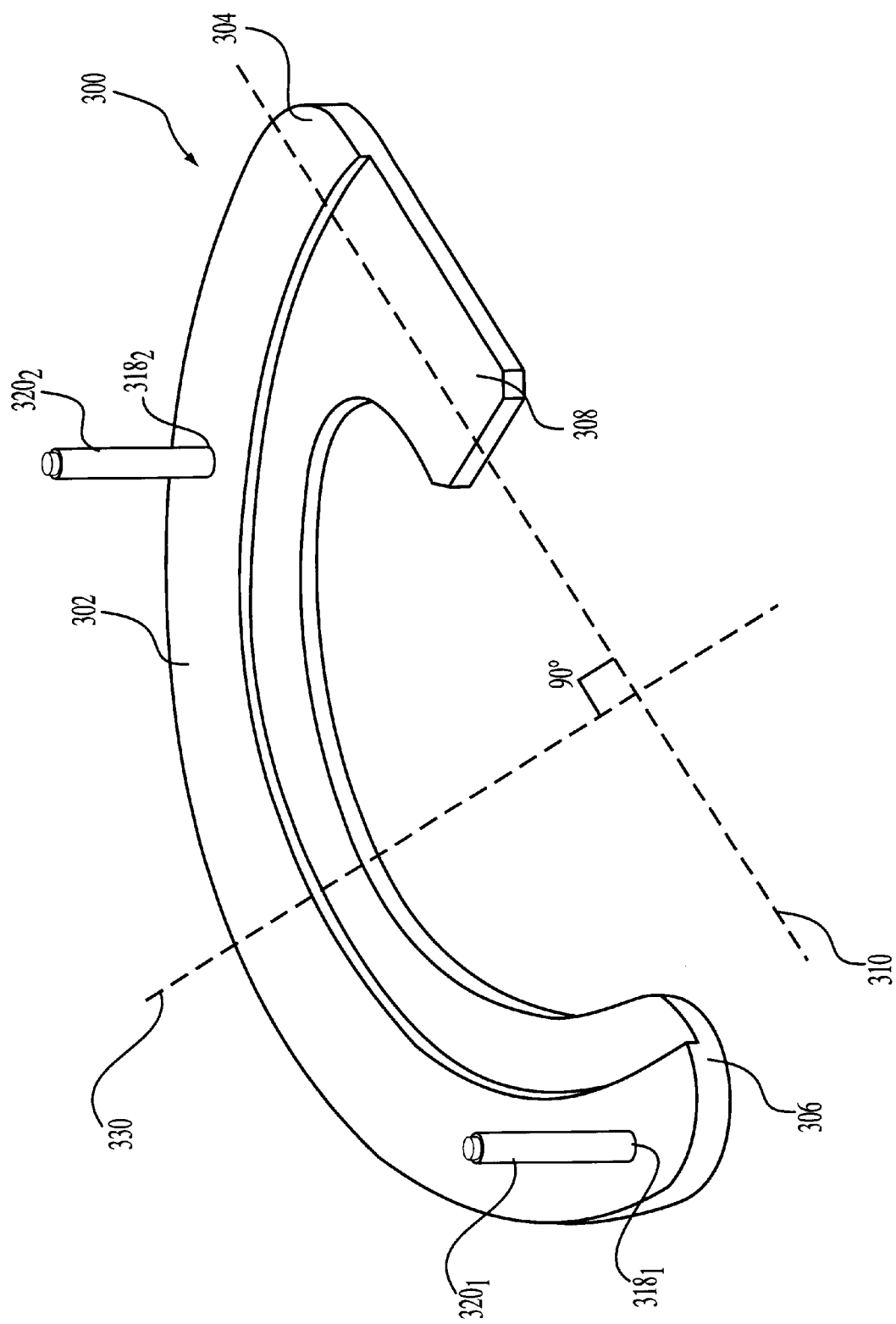
FIG. 3 depicts a perspective view of an alignment pin support of the present invention.

FIG. 3 depicts a perspective view of an additional component of the present invention. Specifically, an alignment pin support 300 is depicted as a C-shaped body 302 having a first end 304 and a second end 306. The first end 304 transitions into an extension tab 308. The extension tab 308 extends radially inward from the C-shaped body 302. The extension tab 308 partially defines an x-axis 310 for the alignment pin support 300. Perpendicular to the x-axis 310 is a y-axis 330 which corresponds to the y-axis 130 of the central body 104. The alignment pin support 300 is further provided with at least two alignment pins 320$_1$ and 320$_2$. The alignment pins 320$_1$ and 320$_2$ are disposed in alignment pin bores 318$_1$ and 318$_2$ respectively and in a preferred embodiment of the invention measure approximately 1.5 in. length. Preferably, the alignment pin bores, hence the alignment pins, are disposed on the alignment pin support 300 at angles of approximately +60° and −60° respectively with respect to the y-axis 330 of the support 300.

Returning to FIG. 2, the alignment pin support 300 is connected to the assembly 206 via a connector 220 disposed below the substrate support chuck 202. Specifically, the connector 220 is a grooved body that is fashioned so as to receive the extension tab 308 of the alignment pin support 300. As such, the alignment pins 320$_1$ and 320$_2$ pass through corresponding bores 218 in the substrate support chuck 202 and communicate with previously mentioned and corresponding alignment bores 120$_1$ and 120$_2$ of the central body 102. Note that only one shown alignment pin 320$_2$, bore 218 (in phantom) and alignment bore 120$_2$ is depicted in FIG. 2. To align the central body 102 with the chuck surface 204, the alignment pins extend into surface features of the chuck such as the alignment bores or alternately backside gas distribution ports, lift pin holes or the like. The outer body 104 rests upon the flange 208 and contains a notch or edge extension (not shown) to ensure coaxial alignment with the flange 208.

The stencil contains approximately 270 apertures 108 that are arrayed, for example, in a pattern of concentric rings 124. Each aperture 108, has the form of a countersunk hole or bore (a funnel shape) with the larger opening of the countersunk hole on the upper surface 116 of the central body 102. Each aperture also contains a counterbore 122 (see FIG. 2) that is coaxially aligned with the countersunk hole and located in the bottom surface 118 of the central body 102. Illustratively, each countersunk hole has a large diameter of approximately 0.164 inches (4.2 mm), an angle of approximately 82 degrees and a small diameter of approximately 0.060 inches (1.5 mm) deep. Opposite each countersunk hole is a counterbore having a diameter of approximately 0.090 inches (2.3 mm) and a depth of 0.008 inches (0.2 mm). Many other sizes and arrangements of apertures are available and all such variations are considered within the scope of the present invention.

Typically, the material of the stencil 100 is a ceramic and in a preferred embodiment of the invention, is alumina. Other materials can be used such as silicon, aluminum nitride, boron nitride and the like. The choice of material depends on the type of system the stencil 100 will be used in. For example, in PVD systems, materials that minimize differential thermal expansion and maintain their shape (especially flatness with respect to the substrate support surface 204) are the most desirable materials for the stencil 100. Another consideration in choosing stencil 100 material is the material that will be sputtered in the system to form deposits on the surface 204 of the substrate support chuck 202. For example, it is impossible to clean and reuse a titanium mask that has been sputtered with titanium. Therefore, if a reusable mask is desirable, the mask should be fabricated from a different material than that which is being sputtered, e.g., a silicon mask for sputtering titanium and a metallic mask,e.g. stainless steel or titanium for sputtering dielectric material.

The method of forming deposits on the surface 204 of the substrate support chuck 202 begins with placement of the stencil 100 onto the substrate support surface 204 within a PVD system 200. In addition to the chuck 202, the PVD system 200 conventionally contains an enclosure 230 (vacuum chamber) containing a pressure control device (i.e., vacuum pump) 226, a target 228 and one or more rings 212 and/or shields 214 described above for confining the deposition proximate the chuck. The PVD system is a conventional system that is operated in a conventional manner to cause sputtering of the target material upon the stencil and the exposed support surface of the chuck. The deposition material is a material that bonds to and is thermally compatible with the chuck material. For example, for ceramic chucks, deposition materials include boron-nitride, diamond, oxides, such as aluminum-oxide, and metals such as titanium. In general, this technique for patterned deposition of materials is known as lift-off deposition.

To fabricate a sufficient wafer support mask, the PVD system 200 deposits approximately a 1 micron layer of material on the substrate support chuck 202 while the stencil 100 is positioned on the surface 204 of the chuck 202. Deposition material passes through the apertures of the stencil onto the surface of the substrate support chuck. Additionally, a second layer of material may be deposited over the first layer such that an insulator may be first deposited and a conductor deposited thereover. Any number of layers comprising various materials can be deposited using the inventive stencil. Following the deposition, the target is removed from the chamber such that the stencil can be removed from the surface through the top of the PVD system enclosure. The result is a pattern of deposition material atop the surface 204, edge 216 and the flange surface 210.

Figure 4:
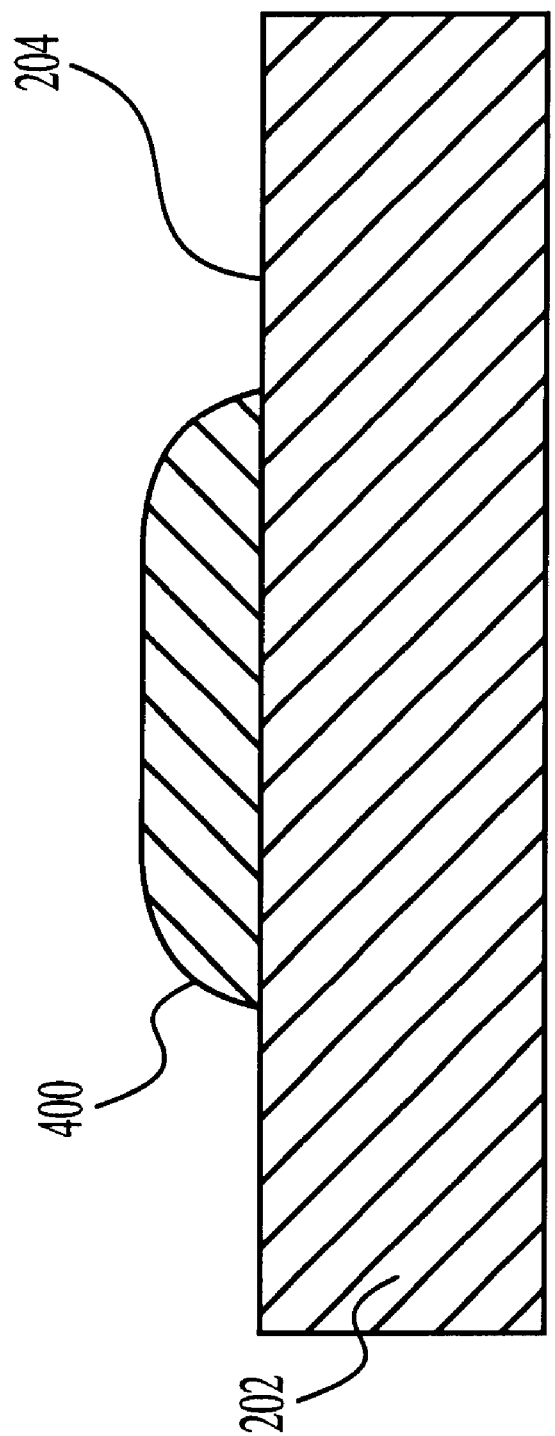
FIG. 4 depicts a vertical cross-sectional view of a resulting deposit of target material on the surface of the substrate support chuck.

The combination of the countersunk holes and the counterbores ensures a uniform deposit of material during the deposition process. Specifically, FIG. 4 depicts a vertical cross-sectional view of a resulting deposit 400 of target material on the surface 204 of the substrate support chuck 202. The counterbores prevent sticking of the stencil to the deposited material and provide material deposits having convex (domed) surfaces. Also, the countersunk apertures increase deposition rate by providing a wide aperture to permit deposition of material at a wide range of trajectory angles for the deposition material particles. It is easily seen that a plurality of such deposits 400 are formed on the surface 204 as a result of the plurality of apertures 108 and slots 106 in the stencil 100. Therefore, a wafer spacing mask comprising the plurality of such deposits 400 as discussed earlier can be formed on a large number of substrate support chucks in a relatively fast and highly repeatable manner.

Although various embodiments which incorporate the teachings of the present invention have been shown and described in detail herein, those skilled in the art can readily devise many other varied embodiments that still incorporate these teachings.

What is claimed is:

1. Apparatus for fabricating a wafer spacing mask on a substrate support chuck, said substrate support chuck having a support surface and a flange extending radially outward of said support surface, said apparatus comprising:

a central body, disposed upon said support surface; and an outer body disposed upon said flange.

2. The apparatus of claim 1 wherein said central body further comprises a plurality of apertures disposed therein and a plurality of slots disposed about a periphery of said central body.

3. The apparatus of claim 2 wherein said plurality of apertures are 270, arranged as a pattern of concentric rings and said plurality of slots is 9.

4. The apparatus of claim 1 wherein said outer body is ring shaped.

5. The apparatus of claim 1 wherein said central body and said outer body are fabricated from the same material.

6. The apparatus of claim 5 wherein said material is selected from the group consisting of ceramic, silicon, aluminum nitride and boron nitride.

7. The apparatus of claim 6 wherein said material is alumina.

8. The apparatus of claim 1 further comprising an alignment pin support disposed below said central body.

9. The apparatus of claim 8 wherein the alignment pin support has at least two alignment pins projecting upward therefrom.

10. The apparatus of claim 9 wherein said at least two alignment pins communicate with a corresponding number of alignment bores disposed in the central body.

11. The apparatus of claim 9 wherein said at least two alignment pins are disposed at angles of +60° and −60° respectively with respect to a y-axis of the alignment pin support.

12. The apparatus of claim 8 wherein said alignment pin support is a C-shaped body having a first end and a second end wherein the first end transitions to an extension tab.

13. The apparatus of claim 12 wherein the extension tab is received in a connector of a chamber assembly.

* * * * *